(12) United States Patent
Balakrishnan et al.

(10) Patent No.: US 9,716,173 B1
(45) Date of Patent: Jul. 25, 2017

(54) COMPRESSIVE STRAIN SEMICONDUCTOR SUBSTRATES

(71) Applicant: INTERNATIONAL BUSINESS MACHINES CORPORATION, Armonk, NY (US)

(72) Inventors: Karthik Balakrishnan, White Plains, NY (US); Pouya Hashemi, White Plains, NY (US); Nicolas J. Loubet, Guilderland, NY (US); Alexander Reznicek, Troy, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/292,663

(22) Filed: Oct. 13, 2016

(51) Int. Cl.
*H01L 29/78* (2006.01)
*H01L 29/10* (2006.01)
*H01L 21/02* (2006.01)

(52) U.S. Cl.
CPC ...... *H01L 29/7849* (2013.01); *H01L 21/0243* (2013.01); *H01L 21/02381* (2013.01); *H01L 21/02414* (2013.01); *H01L 29/1079* (2013.01)

(58) Field of Classification Search
CPC .......... H01L 21/02639; H01L 21/0254; H01L 21/0262; H01L 21/02647; H01L 21/02381
See application file for complete search history.

(56) References Cited

U.S. PATENT DOCUMENTS

| 6,610,548 | B1 | 8/2003 | Ami et al. |
| 6,852,575 | B2 | 2/2005 | Bojarczuk, Jr. et al. |
| 7,135,699 | B1 | 11/2006 | Atanackovic |
| 7,364,989 | B2* | 4/2008 | Tweet ................. H01L 21/3147 257/632 |
| 2014/0077338 | A1* | 3/2014 | Roucka ............ H01L 21/02381 257/613 |

* cited by examiner

*Primary Examiner* — Quoc Hoang
(74) *Attorney, Agent, or Firm* — Tuntinjian & Bitetto, P.C.; Louis J. Percello

(57) ABSTRACT

A method for forming a compressively strained semiconductor substrate includes forming a lattice adjustment layer on a semiconductor substrate by forming compound clusters within an epitaxially grown semiconductor matrix. The lattice adjustment layer includes a different lattice constant than the semiconductor substrate. A rare earth oxide is grown and lattice matched to the lattice adjustment layer. A semiconductor layer is grown and lattice matched to the rare earth oxide and includes a same material as the semiconductor substrate such that the semiconductor layer is compressively strained.

18 Claims, 2 Drawing Sheets

```
┌─────────────────────────────────────────────────────────┐
│ Form lattice adjustment layer with smaller lattice      │
│ constant than a substrate on which it is formed - 102   │
│                                                         │
│   ┌─────────────────────────────────────────────────┐   │
│   │ Epitaxially grow the lattice adjustment layer   │   │
│   │ with compound clusters (e.g., $Si_3P_4$         │   │
│   │ crystals) - 104                                 │   │
│   └─────────────────────────────────────────────────┘   │
│                                                         │
│   ┌─────────────────────────────────────────────────┐   │
│   │ Relax strain in the lattice adjustment layer    │   │
│   │ - 106                                           │   │
│   └─────────────────────────────────────────────────┘   │
└─────────────────────────────────────────────────────────┘
                            │
                            ▼
┌─────────────────────────────────────────────────────────┐
│ Grow rare earth oxide lattice matched to the lattice    │
│ adjustment layer                                        │
│                       108                               │
│   ┌─────────────────────────────────────────────────┐   │
│   │ Select stoichiometry of the rare earth oxide to │   │
│   │ lattice match the lattice adjustment layer - 110│   │
│   └─────────────────────────────────────────────────┘   │
└─────────────────────────────────────────────────────────┘
                            │
                            ▼
┌─────────────────────────────────────────────────────────┐
│ Grow semiconductor layer with compressive strain on the │
│ rare earth oxide - 112                                  │
└─────────────────────────────────────────────────────────┘
                            │
                            ▼
┌─────────────────────────────────────────────────────────┐
│ Form devices in the semiconductor layer with compressive│
│ strain - 114                                            │
└─────────────────────────────────────────────────────────┘
```

COMPRESSIVE STRAIN SEMICONDUCTOR SUBSTRATES

BACKGROUND

Technical Field

The present invention generally relates to semiconductor devices, and more particularly to substrates and methods for fabrication that yield a compressive strain employed for formation of semiconductor devices.

Description of the Related Art

Strained silicon and strained silicon-on-insulator (SOI) can provide enhanced properties for semiconductor devices. For example, p-type field effect transistors (PFETs) have improved performance when formed with a compressive strain channel, and n-type field effect transistors (NFETs) have improved performance when formed with a tensile strain channel. Tensile strain devices are easily formed using, e.g., relaxed SiGe buffer layers or SiGe condensation. Compressively strained silicon is much more difficult to achieve. Globally compressive strained substrates are not presently known.

SUMMARY

In accordance with an embodiment of the present invention, a method for forming a compressively strained semiconductor substrate includes forming a lattice adjustment layer on a semiconductor substrate by forming compound clusters within an epitaxially grown semiconductor matrix. The lattice adjustment layer includes a different lattice constant than the semiconductor substrate. A rare earth oxide is grown and lattice matched to the lattice adjustment layer. A semiconductor layer is grown and lattice matched to the rare earth oxide and includes a same material as the semiconductor substrate such that the semiconductor layer is compressively strained.

Another method for forming a compressively strained semiconductor substrate includes epitaxially growing a first silicon layer on a silicon substrate and introducing an overabundance of phosphine into a process gas to form $Si_3P_4$ within the first silicon layer, the first silicon layer having a smaller lattice constant than the silicon substrate; growing a rare earth oxide lattice matched to the first silicon layer; and growing a second silicon layer by lattice matching the second silicon layer to the rare earth oxide such that a lattice mismatch provides compressive strain in the second silicon layer.

A compressively strained semiconductor substrate includes a lattice adjustment layer formed on a semiconductor substrate, the lattice adjustment layer including compound clusters formed within an epitaxially grown semiconductor matrix, the lattice adjustment layer including a smaller lattice constant than the semiconductor substrate. A rare earth oxide is lattice matched to the lattice adjustment layer. A semiconductor layer is lattice matched to the rare earth oxide and including a same material as the semiconductor substrate such that the semiconductor layer is compressively strained.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein:

FIG. 4 is a block/flow diagram showing a method for forming a compressively strained semiconductor layer in accordance with an embodiment of the present invention.

DETAILED DESCRIPTION

Figure 1:
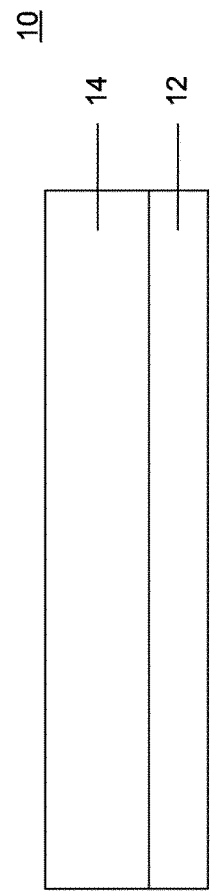
FIG. 1 is a cross-sectional view showing a lattice adjustment layer formed on a substrate that alters the lattice constant in accordance with an embodiment of the present invention.

In accordance with aspects of the present invention, methods and structures are provided to form global compressively strained substrates, large embedded substrate sections or local substrate sections. In some embodiments, the substrate can include a bulk substrate or be a multilayered substrate having one or more semiconductor layers rendered compressive. In one example, of a multiple layered substrate, a silicon-on-insulator (SOI) substrate can be employed. Compressive properties can be applied to the semiconductor layer from the base substrate of the SOI structure.

In useful embodiments, a compound is inserted into a lattice of the semiconductor material to alter a lattice constant of the semiconductor material. The compound can include a material that is a crystalline compound and is preferably chemically bound with the material of the lattice. The compound can thus form a semiconductor crystal within a semiconductor matrix and affect the lattice constant of the overall layer.

In one embodiment, $Si_3P_4$ is provided in a silicon lattice to provide a tensily strained layer. $Si_3P_4$ is formed when an overabundance of phosphine is provided in a process gas during a fast growing low temperature epitaxial silicon process. The $Si_3P_4$ compound gets incorporated into the silicon lattice and creates a tensile strain (compared to the underlying silicon substrate lattice). Most of the phosphorus is chemically bound. Since there is an overabundance of phosphorus, the $Si_3P_4$ containing silicon layer is highly n-doped. However, the bound phosphorus forms crystal clusters of $Si_3P_4$ within the silicon to change the lattice constant of the silicon. $Si_3P_4$ is very thermally stable; however, if grown too thick the $Si_3P_4$ containing silicon layer starts to relax, similar to the critical thickness of thick SiGe layers.

It is to be understood that aspects of the present invention will be described in terms of a given illustrative architecture; however, other architectures, structures, substrate materials and process features and steps can be varied within the scope of aspects of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., lanthanum-yttrium oxide ($LaYO_3$). These compounds include different proportions of the elements within the compound, e.g., $(La_xY_{1-x})_2O_3$ where x is less than or equal to 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Referring now to the drawings in which like numerals represent the same or similar elements and initially to FIG. 1, a substrate system 10 includes a substrate 12 and a lattice adjustment layer 14. The lattice adjustment layer 14 is formed on the substrate 12 and includes a lattice match altering material. In one embodiment, the lattice adjustment layer 14 includes silicon with $Si_3P_4$ formed therein. The substrate system 10 can include a substrate structure including but not limited to a bulk substrate or a silicon on insulator substrate (SOI).

In one example, the bulk semiconductor substrate 12 may be a silicon-based material. Illustrative examples of Si-based materials suitable for the bulk semiconductor substrate 12 include, but are not limited to monocrystalline forms of Si, SiGe, Ge, and multi-layers thereof. The semiconductor substrate system 10 may also be a SOI substrate where substrate 12 represents the semiconductor layer on top of a buried dielectric layer of a SOI structure (not shown).

Layer 14 is formed by flowing an overabundance of phosphine into a process gas during a fast growing low temperature epitaxial silicon process. In useful embodiments, the fast growing low temperature epitaxial $Si_3P_4$ containing silicon process can include, by way of an example, silane at about 600 torr, 600 degrees C. with a phosphine (e.g., partial pressure of around 1.3 torr) (more generally phosphine partial pressure may be between about 1 and 2 torr) and silane with a partial pressure of about 2-7 torr (e.g., about 4.8 torr for the example above) in nitrogen carrier gas. In other examples, silane or dichlorosilane can be provided at between 200 torr to atmospheric pressure, and temperatures above about 600 degrees C. (e.g., 600-750 degrees C.). Other parameters may also be employed. Other examples can include, e.g., dichlorosilane at 650-750 degrees C. (preferably about 675-700 degrees C.), at a pressure of about 300 torr, with a partial pressure of phosphine about 1.5 torr and dichlorosilane of about 7 torr using nitrogen as a carrier gas.

The $Si_3P_4$ compound gets embedded into the silicon lattice of the substrate 12 to form layer 14 and creates a tensile strain (compared to the underlying silicon substrate lattice). Most of the phosphorus in layer 14 is chemically bound and not electrically active (the overall phosphorus concentration can be about $2\text{-}4\times10^{21}$ atoms/cc, with only a small percentage, e.g., $2\text{-}8\times10^{20}$ atoms/cc being electrically active).

Layer 14 is grown to be in a relaxed state (negligible strain). This can be achieved by growing a thick layers of silicon containing $Si_3P_4$. The strain relaxation of layer 14 increases with thickness. For example, higher strain is provided in thinner layers of $Si_3P_4$ clusters in Si and decreases until fully relaxed at about 2 microns in thickness. Layer 14 is grown to about 2 microns to achieve strain relaxation.

The $Si_3P_4$ clusters form a compound within the Si a lattice of the semiconductor material to alter a lattice constant of the semiconductor material. The compound can include a material that is a crystalline compound and is preferably chemically bound with the material of the lattice. The compound can thus form a semiconductor crystal within a semiconductor matrix and affect the lattice constant of the overall layer. Most of the phosphorus is chemically bound.

Figure 2:
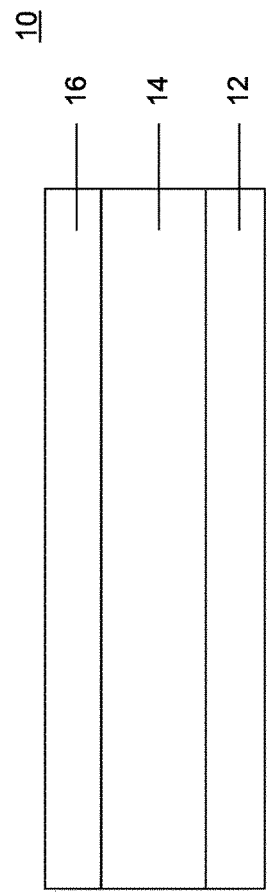
FIG. 2 is a cross-sectional view showing a rare earth oxide formed on the lattice adjustment layer and lattice matched to the lattice adjustment layer in accordance with an embodiment of the present invention.

Referring to FIG. 2, a rare earth oxide (REO) 16 is grown on layer 14. The REO 16 can be epitaxially grown by, e.g., molecular beam epitaxy (MBE) or other epitaxial growth process. In a less preferred embodiment pulsed laser deposition may be employed (PLD).

The terms "epitaxial growth and/or deposition" and "epitaxially formed and/or grown," mean the growth of a semiconductor material (crystalline material) on a deposition surface of another semiconductor material (crystalline material), in which the semiconductor material being grown (crystalline over layer) has substantially the same crystalline characteristics as the semiconductor material of the deposition surface (seed material). In an epitaxial deposition process, the chemical reactants provided by the source gases are controlled, and the system parameters are set so that the depositing atoms arrive at the deposition surface of the semiconductor substrate with sufficient energy to move about on the surface such that the depositing atoms orient themselves to the crystal arrangement of the atoms of the deposition surface. Therefore, an epitaxially grown semiconductor material has substantially the same crystalline characteristics as the deposition surface on which the epitaxially grown material is formed.

The rare earth oxide 16 is lattice matched to layer 14. For lattice matching of an epitaxial oxide (e.g., rare earth oxide 16) to the silicon lattice of layer 14, rare earth oxides with stable stoichiometry and stable cubic crystal structure can be employed. The rare earth oxides can include, for example, gadolinium (III)-oxide ($Gd_2O_3$), dysprosium (III)-oxide ($Dy_2O_3$), holmium (III) oxide ($Ho_2O_3$), erbium (III) oxide ($Er_2O_3$), thulium (III) oxide ($Tm_2O_3$), lutetium (III) oxide ($Lu_2O_3$) or cerium (IV) oxide ($CeO_2$).

In some embodiments, a ternary oxide can also be employed, e.g., lanthanum-yttrium oxide ($(La_xY_{1-x})_2O_3$) or gadolinium-erbium oxide ($(Gd_xEr_{1-x})_2O_3$), etc. may be employed. The ternary oxides crystallize in a cubic form. In one embodiment, $(La_xY_{1-x})_2O_3$ may be employed where x can be between about 0.3 and 0.35, and preferably about 0.33. The lanthanum-yttrium oxide includes a lattice constant that is about two times that of Si permitting lattice matching. The yttrium has to be the majority compound to ensure a cubic lattice is formed, for the yttrium-lanthanum-oxide system ($(La_xY_{1-x})_2O_3$).

In accordance with aspects of the present invention, layer 14 and layer 16 are lattice matched by an epitaxial growth process. Layer 14 includes a lattice constant that is smaller than the lattice constant of the underlying silicon substrate 12 due to the effects of the $Si_3P_4$ formed in layer 14.

Figure 3:
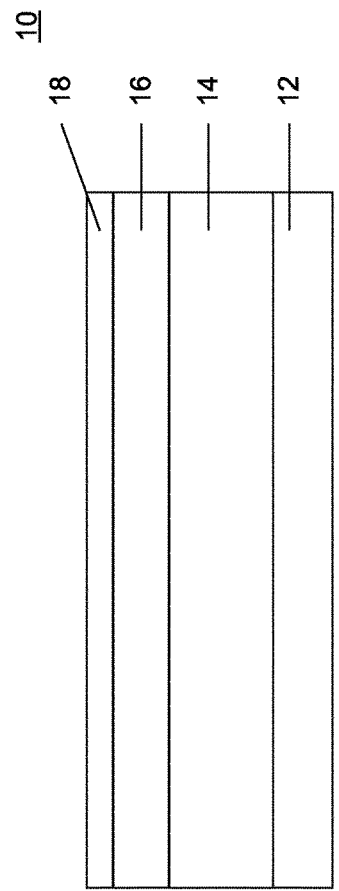
FIG. 3 is a cross-sectional view showing a compressively strained semiconductor layer formed on the rare earth oxide, the compressively strained semiconductor layer being lattice matched to the rare earth oxide in accordance with an embodiment of the present invention.

Referring to FIG. 3, a semiconductor layer 18 is epitaxially grown on the rare earth oxide 16. In one embodiment, the semiconductor layer 18 includes silicon. Since the rare earth oxide 16 is epitaxially grown on the layer 14, the rare earth oxide 16 has a lattice constant that is smaller than that of silicon (substrate 12). This slight lattice mismatch results in a compressive strain in the silicon of layer 18. Using this structure, a SOI substrate system 10 is provided with the substrate and layer 14 forming a base substrate, the rare earth oxide 16 forming a buried dielectric and the semiconductor layer 18 forming the semiconductor portion.

The substrate system 10 may be employed for the formation of PFETs or other components that would benefit from a compressively strained substrate. It should understood that the structure 10 may be formed across an entire wafer or chip or over smaller sections or portions of the wafer or chip.

In accordance with aspects of the present invention, accommodating lattice constants can be provided by selecting an appropriate rare earth oxide. The rare earth oxide may include different compounds or compounds with different stoichiometry. Table 1 shows an illustrative example of stoichiometric matching using $(La_xY_{1-x})_2O_3$.

TABLE 1

Stoichiometry for tensile silicon containing $Si_3P_4$ lattice matched epitaxial oxide layer $((La_xY_{1-x})_2O_3)$

| $Si_3P_4$ (Si:C % equivalent) | Lattice constant [A] | Twice the lattice constant (2[A]) | x-value for $(La_xY_{1-x})_2O_3$ |
|---|---|---|---|
| 0% | 5.431 | 10.862 | 0.33 |
| 0.5% | 5.421 | 10.84 | 0.31 |
| 1.0% | 5.411 | 10.82 | 0.288 |
| 1.25% | 5.406 | 10.81 | 0.272 |
| 1.5% | 5.402 | 10.80 | 0.262 |
| 2% | 5.392 | 10.78 | 0.236 |

Here, $Si_3P_4$ atomic percent is expressed as an equivalent atomic percent as provided in a percent of C in Si:C as measured by high-resolution x-ray diffraction (HRXRD). The lattice constant [A] is the lattice constant of the $Si_3P_4$ containing silicon layer 14 that is matched by $(La_xY_{1-x})_2O_3$ for a given value of x. The lattice constants are expressed in Angstroms. For other semiconductor systems, different epitaxial oxides can be employed to lattice match the $Si_3P_4$ containing silicon layer 14. Some examples can include gadolinium (III)-oxide ($Gd_2O_3$), dysprosium (III)-oxide ($Dy_2O_3$), holmium (III) oxide ($Ho_2O_3$), erbium (III) oxide ($Er_2O_3$), thulium (III) oxide ($Tm_2O_3$), lutetium (III) oxide ($Lu_2O_3$), cerium (IV) oxide ($CeO_2$) or ternary compounds, as follows.

In block 110, the rare earth oxide is lattice matched to the lattice adjustment layer by selecting a stoichiometry (e.g., adjusting x) of the rare earth oxide.

TABLE 2

Stoichiometry for tensile $Si_3P_4$ containing Silicon lattice matched epitaxial oxide layers

| $Si_3P_4$ (Si:C % equivalent) | Lattice constant [A] | Twice the lattice constant (2[A]) | $(La_xY_{1-x})_2O_3$ | | $(Gd_xEr_{1-x})_2O_3$ | | $(Nd_xEr_{1-x})_2O_3$ | | $(Nd_xGd_{1-x})_2O_3$ | | $(La_xEr_{1-x})_2O_3$ | |
|---|---|---|---|---|---|---|---|---|---|---|---|---|
| | | | La % | Y % | Gd % | Er % | Nd % | Er % | Nd % | Gd % | La % | Er % |
| 0.5% | 5.421 | 10.84 | 31 | 69 | | | 55.1 | 44.9 | 11.8 | 88.2 | 55.1 | 44.9 |
| 1.0% | 5.411 | 10.82 | 28.5 | 71.5 | | | 51.3 | 48.7 | 4.4 | 95.6 | 32.8 | 67.2 |
| 1.25% | 5.406 | 10.81 | 27.2 | 72.8 | 100 | | 49.4 | 50.6 | | 100 | 31.6 | 68.5 |
| 1.5% | 5.402 | 10.80 | 26.2 | 73.8 | 97.7 | 2.3 | 47.9 | 52.1 | | | 30.6 | 69.4 |
| 2.0% | 5.392 | 10.78 | 23.6 | 76.4 | 90 | 10 | 44.1 | 55.9 | | | 28.2 | 71.8 |

The rare earth oxides include a cubic epitaxial oxide layer, which is usable to form compressive silicon in a SOI structure.

Referring to FIG. 4, methods for forming a semiconductor substrate with compressive strain are illustratively shown. In some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

In block 102, a lattice adjustment layer is formed on a semiconductor substrate by introducing a material into the lattice adjustment layer. The lattice adjustment layer includes a smaller lattice constant than the semiconductor substrate by the formation of a silicon-containing compound, e.g., $Si_3P_4$.

In block 104, an overabundance of phosphine is introduced into process gas while forming epitaxial silicon for the lattice adjustment layer on the semiconductor substrate. This forms clusters or crystals of $Si_3P_4$ in the lattice adjustment layer. The semiconductor substrate includes silicon and provides a layer for epitaxial growth to form the $Si_3P_4$ containing lattice adjustment layer. In block 106, the lattice adjustment layer is relaxed (negligible strain). The relaxation of strain in the lattice adjustment layer can be provided by forming the lattice adjustment layer to a large enough thickness to provide at least a relaxed strain upper portion of the lattice adjustment layer.

In block 108, a rare earth oxide is grown on the lattice adjustment layer and lattice matched to the lattice adjustment layer. The rare earth oxide may include binary oxides, such as, e.g., gadolinium(III)-oxide ($Gd_2O_3$), dysprosium (III)-oxide ($Dy_2O_3$), holmium(III) oxide ($Ho_2O_3$), erbium (III) oxide ($Er_2O_3$), thulium (III) oxide ($Tm_2O_3$), lutetium (III) oxide ($Lu_2O_3$) or cerium (IV) oxide ($CeO_2$), etc. or ternary oxides including a rare earth metal, such as e.g., Gd, Er, Nd, La and Y forming oxides such as, e.g., lanthanum-yttrium oxide (($La_xY_{1-x})_2O_3$), gadolinium-erbium oxide (($Gd_xEr_{1-x})_2O_3$), neodymium-erbium oxide (($Nd_xEr_{1-x})_2O_3$), neodymium-gadolinium oxide (($Nd_xGd_{1-x})_2O_3$), lanthanum-erbium oxide (($La_xEr_{1-x})_2O_3$), etc.

In block 112, a semiconductor layer is grown on the rare earth oxide and lattice matched to the rare earth oxide. The semiconductor layer includes a same material as the semiconductor substrate. The slight lattice difference causes the semiconductor layer to be compressively strained.

The semiconductor layer with compressive strain may be formed over the entire chip or wafer or sections of portions of the wafer or chip. In block 114, the substrate with the compressively strained semiconductor layer can be employed to form devices, e.g., field effect transistors (FETs) of any type (e.g., FinFETs, vertical FETs, nanowires, planar FETs, etc.). Other components can also be formed in the compressive semiconductor layer. The compressive semiconductor layer can be employed with other regions having tensile strain or no strain as well. In some embodiments, the substrate having a compressively strained semiconductor layer can be provided as a material or product to semiconductor fabrication foundries for production of semiconductor devices.

Having described preferred embodiments for compressive strain semiconductor substrates (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method for forming a compressively strained semiconductor substrate, comprising:
   forming a lattice adjustment layer on a semiconductor substrate by forming compound clusters within an epitaxially grown semiconductor matrix, the lattice adjustment layer including a different lattice constant than the semiconductor substrate;
   growing a rare earth oxide lattice matched to the lattice adjustment layer, wherein the lattice adjustment layer includes $Si_3P_4$ in silicon; and
   growing a semiconductor layer lattice matched to the rare earth oxide and including a same material as the semiconductor substrate such that the semiconductor layer is compressively strained.

2. The method as recited in claim 1, wherein forming the lattice adjustment layer includes introducing an overabundance of phosphine into a process gas while forming epitaxial silicon on the semiconductor substrate.

3. The method as recited in claim 1, wherein forming the lattice adjustment layer includes forming the lattice adjustment layer with negligible strain.

4. The method as recited in claim 1, wherein forming the lattice adjustment layer includes forming the lattice adjustment layer to a thickness that includes negligible strain.

5. The method as recited in claim 1, wherein the rare earth oxide is selected from the group consisting of gadolinium (III)-oxide, dysprosium(III)-oxide, holmium(III) oxide, erbium (III) oxide, thulium (III) oxide, lutetium (III) oxide and cerium (IV) oxide.

6. The method as recited in claim 1, wherein the rare earth oxide includes a ternary compound including a rare earth metal selected from the group consisting of gadolinium, erbium, neodymium, lanthanum and yttrium.

7. The method as recited in claim 1, wherein the lattice constant of the rare earth oxide is matched to the lattice adjustment layer by selecting a stoichiometry of the rare earth oxide.

8. A method for forming a compressively strained semiconductor substrate, comprising:
   epitaxially growing a first silicon layer on a silicon substrate and introducing an overabundance of phosphine into a process gas to form $Si_3P_4$ within the first silicon layer, the first silicon layer having a smaller lattice constant than the silicon substrate;
   growing a rare earth oxide lattice matched to the first silicon layer; and
   growing a second silicon layer by lattice matching the second silicon layer to the rare earth oxide such that a lattice mismatch provides compressive strain in the second silicon layer.

9. The method as recited in claim 8, wherein forming the first silicon layer includes forming the first silicon layer with negligible strain.

10. The method as recited in claim 8, wherein forming the first silicon layer includes forming the first silicon layer to a thickness that provides negligible strain.

11. The method as recited in claim 8, wherein the rare earth oxide is selected from the group consisting of gadolinium(III)-oxide, dysprosium(III)-oxide, holmium(III) oxide, erbium (III) oxide, thulium (III) oxide, lutetium (III) oxide and cerium (IV) oxide.

12. The method as recited in claim 8, wherein the rare earth oxide includes a ternary compound including a rare earth metal selected from the group consisting of gadolinium, erbium, neodymium, lanthanum and yttrium.

13. The method as recited in claim 8, wherein the rare earth oxide is lattice matched to the first silicon layer by selecting a stoichiometry of the rare earth oxide.

14. A compressively strained semiconductor substrate, comprising:
   a lattice adjustment layer formed on a semiconductor substrate, the lattice adjustment layer including compound clusters formed within an epitaxially grown semiconductor matrix, the lattice adjustment layer including a smaller lattice constant than the semiconductor substrate;
   a rare earth oxide lattice matched to the lattice adjustment layer, wherein the lattice adjustment layer includes silicon with compound clusters including $Si_3P_4$; and
   a semiconductor layer lattice matched to the rare earth oxide and including a same material as the semiconductor substrate such that the semiconductor layer is compressively strained.

15. The substrate as recited in claim 14, wherein the lattice adjustment layer is relaxed.

16. The substrate as recited in claim 14, wherein the rare earth oxide is selected from the group consisting of gadolinium(III)-oxide, dysprosium(III)-oxide, holmium(III) oxide, erbium (III) oxide, thulium (III) oxide, lutetium (III) oxide and cerium (IV) oxide.

17. The substrate as recited in claim 14, wherein the rare earth oxide includes a ternary compound including a rare earth metal selected from the group consisting of gadolinium, erbium, neodymium, lanthanum and yttrium.

18. The substrate as recited in claim 14, wherein the lattice adjustment layer includes a thickness of at least 2 microns.

* * * * *